United States Patent [19]
Yoo et al.

[11] Patent Number: 5,940,697
[45] Date of Patent: Aug. 17, 1999

[54] T-GATE MESFET PROCESS USING DIELECTRIC FILM LIFT-OFF TECHNIQUE

[75] Inventors: Hyung Mo Yoo, San Jose, Calif.; Xuan Nguyen, Kyung, Rep. of Korea

[73] Assignee: Samsung Electronics Co., Ltd., Seoul, Rep. of Korea

[21] Appl. No.: 08/941,126

[22] Filed: Sep. 30, 1997

[51] Int. Cl.⁶ .................................................. H01L 21/338
[52] U.S. Cl. ........................... 438/182; 438/577; 438/579
[58] Field of Search ................................ 438/167, 182, 438/574, 576, 577, 578, 579

[56] References Cited

U.S. PATENT DOCUMENTS

| | | | |
|---|---|---|---|
| 4,700,462 | 10/1987 | Beaubien et al. | 438/182 |
| 5,139,968 | 8/1992 | Hayase et al. | 438/579 |
| 5,304,511 | 4/1994 | Sakai | 438/579 |
| 5,587,328 | 12/1996 | Yoshida | 438/577 |
| 5,776,805 | 7/1998 | Kim | 438/182 |

*Primary Examiner*—Chandra Chaudhari
*Attorney, Agent, or Firm*—Townsend and Townsend and Crew LLP

[57] ABSTRACT

An improved method for forming a T-gate structure in a MESFET includes dielectric lift-off steps.

8 Claims, 2 Drawing Sheets

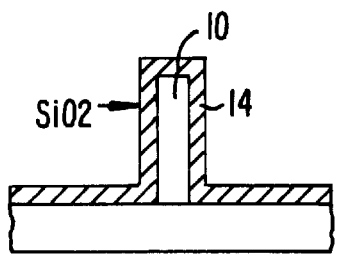
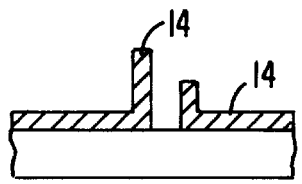
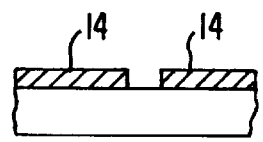
FIG. 8A.   FIG. 8B.   FIG. 8C.
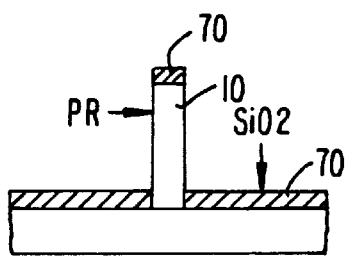
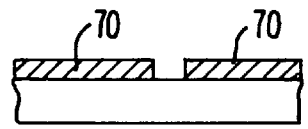
FIG. 9A.   FIG. 9B.
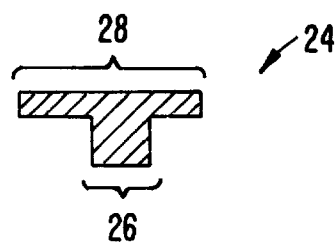
FIG. 10.

T-GATE MESFET PROCESS USING DIELECTRIC FILM LIFT-OFF TECHNIQUE

BACKGROUND OF THE INVENTION

Demand for wireless communication products increases exponentially every year. As the demand increases, frequency bands shift to the higher side since it is not possible to provide for all the demands at a given frequency band. Currently, there are many wireless communication products that operate in the 900 Mhz, 1.9 GHz, and 2.5 GHz bands. The operating frequency of Personal Communications System (PCS) including cellular is in 824 to 5850 MHz in six non-continuous bands.

As operating frequency increases, semiconductor device geometry has to shrink. A 1.0 micron gate length must shrink to 0.5 microns or less as frequency increases. A shorter gate length means faster electron transit time under the gate, which is necessary for high frequency operation. However, gate (metal) resistance increases as the gate length is reduced, thereby degrading device performance (such as gain and noise figure). This degradation becomes severe as operating frequency increases.

There are a variety of different techniques for reducing gate resistance. FIG. 10 depicts a T-gate 24 where the bottom 26 of the "T" defines the reduced gate width and the top 28 of the "T" is large to prevent increasing the gate resistance. Other techniques are the Y-gate and mushroom gate configurations.

However, these techniques require complicated processing techniques or advanced processing equipment. For example, one technique requires eleven process steps including deposition and etching of nitride layer to form a gate recess.

An etch-back process used in silicon processing (deposit dielectric film, define gate by photolithography, and etch film) requires critical dimension control twice: 1) in photoresist opening, and 2) during dielectric film etching.

The Self-Aligned Implantation for n+− Layer Technology (SAINT) developed by NTT, Japan uses a silicon oxide lift-off technique where the photoresist defining gate sits on silicon nitride. In SAINT the gate contact region is opened by etching silicon nitride in reactive ion etching (RIE) using silicon oxide as an etching mask. Thus, the SAINT technique has the same drawbacks as the etch-back process described above.

SUMMARY OF THE INVENTION

According to one aspect of the invention, a T-gate structure in a metal semiconductor field effect transistor (MESFET) is fabricated utilizing a dielectric lift-off process that does not require expensive processing equipment or complicated processing steps.

According to another aspect of the invention, a gate-defining photoresist LFG is deposited on the major surface of a GaAs substrate and the dielectric lift-off layer is deposited directly on the major surface.

According to another aspect of the invention, the dielectric lift-off layer is deposited by sputtering an $SiO_2$ layer onto the major surface.

According to another aspect of the invention, the dielectric lift-off layer is evaporated onto the major surface.

According to another aspect of the invention the evaporated layer may be composed of $SiO_2$, $Si_3N_4$, or $SiO_xN_y$;

According to another aspect of the invention, the major surface of the substrate is processed to improve adhesion to the dielectric lift-off layer.

According to another aspect of the invention, the sputtered oxide layer is scrubbed after lift-off to remove fingers.

Other features and advantages of the invention will be apparent in view of the following detailed description and appended drawings.

BRIEF DESCRIPTION OF THE DRAWINGS

FIGS. 8A–8C are detailed cross-sectional views of structures resulting from sputtering and lift-off steps;

FIGS. 9A–9B depict structures resulting from an evaporation dielectric deposition process; and FIG. 10 depicts a T-gate structure.

DETAILED DESCRIPTION OF THE PREFERRED EMBODIMENTS

A preferred embodiment of the inventive process will now be described with reference to the figures, where like or similar parts will be given the same reference numbers throughout the several views. The steps for forming a T-gate according to a preferred embodiment of the invention will now be described with reference to FIGS. 1–7.

Most of the steps described utilize standard processing techniques well-known in the art. These techniques will not be described in detail.

Figure 1:
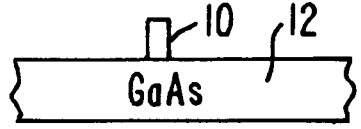
FIGS. 1–7 depict structures resulting from process steps of a preferred embodiment of the invention.

FIG. 1 depicts the placement of a 0.5 micron light field gate (LFG) 10, which functions as lift-off gate masking, on the surface of a gallium arsenide substrate 12. The width of the LFG 10 defines the gate width of the MESFET. The LFG 10 is formed by depositing a layer of photoresist on the surface of substrate 12 and removing the layer except at the location of the LFG 10. Unlike prior art techniques, the gate defining photoresist 10 is sitting directly on the substrate surface instead of a deposited dielectric layer.

An important feature of the present invention is providing good adhesion of sputtered oxide on the GaAs surface and clean lift-off. Details of processing steps required are described below with reference to FIG. 9.

Figure 2:
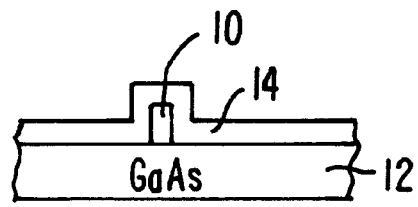

FIG. 2 depicts the structure after an $SiO_2$ (oxide) layer 14 is sputtered onto the structure of FIG. 1.

Figure 3:
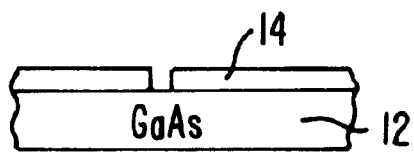

FIG. 3 depicts the structure resulting after the oxide has been lifted off. The lift-off step will be described in greater detail below.

Figure 4:
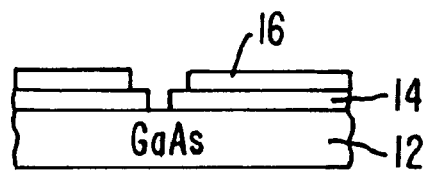

FIG. 4 depicts the structure after a T-gate masking photoresist layer 16 has been deposited. This layer is deposited and patterned utilizing standard techniques. The cross-sectional dimension of the opening defined by the T-gate masking layer determines the size of the top of the T.

Figure 5:
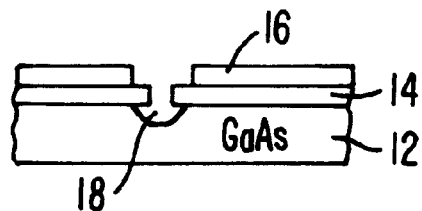

FIG. 5 depicts the structure resulting after recess etching, where a gate recess opening 18 is formed in the substrate 12.

Figure 6:
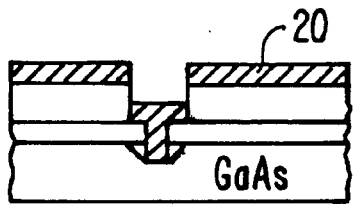

FIG. 6 depicts the structure after a gate metallization layer 20 has been deposited over the T-gate masking photoresist layer 16.

Figure 7:
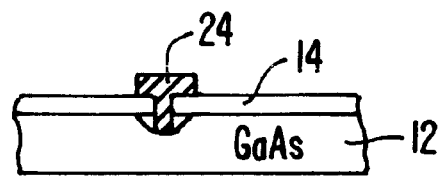

Finally, FIG. 7 depicts the T-gate 24 resulting after the lift-off of the remaining part of the metallization 20 performed by removing the underlying photoresist layer 16.

As described above, critical processing steps are required for assuring good adhesion of oxide to the substrate surface and clean lift-off. In a preferred embodiment, the following steps are performed:

1) Bake photoresist at 90 C. for 30 minutes;

2) $O_2$ barrel at 200 watts for 10 minutes;

3) Clean GaAs in 1:1 (Hel:DI) solution for 30 seconds;
4) DI rinse for 30 seconds;
5) Spin dry in $N_2$ condition;
6) Sputter 1000 angstroms of oxide;
7) Soak in acetone for 30 minutes;
8) Ultrasonic treat for 2 minutes;
9) Repeat ultrasonic in fresh acetone for 2 minutes;
10) Rinse in IPA (isopropyl alcohol);
11) Scrub with IPA and sponge;
12) Rinse in IPA;
13) Repeat ultrasonic in fresh acetone 2 minutes;
14) Rinse in IPA;
15) DI spray 60 seconds; and
16) $N_2$ dry.

The oxide lift-off does not work well in a small area. FIGS. 9A–C depict cross-sectional views of the structures resulting from the oxide sputtering and lift-off processes. FIG. 9A depicts the LFG 10 covered by oxide 14 after the sputtering process. After lift-off notches may remain. Scrubbing helps the oxide lift-off and removes any notches that remain.

An alternative to oxide sputtering is evaporation of a dielectric film. If a dielectric film is evaporated by an E-beam, then scrubbing is not necessary after lift-off because no notches are left.

The evaporation process provides freedom of choice in dielectric film selection, e.g., $SiO_2$, $Si_3N_4$, or $SiO_xN_y$, may be chosen.

FIGS. 9A and B depict cross-sectional views of structures resulting from the evaporation process. Note the clean lift-off of the dielectric film over the gate opening.

The present process of the present invention does not require the deposition and etching of a dielectric film for forming the gate recess. Additionally, the plasma damage of the substrate resulting form the etch back process does not occur for this process.

The invention has now been described with reference to the preferred embodiments. Alternatives and substitutions will now be apparent to persons of skill in the art. For example, the particular steps for preparing the major surface have been found to be effective. Other process steps known in the art can be substituted. Accordingly, it is not intended to limit the invention except as provided by the appending claims.

What is claimed is:

1. A method for forming a T-gate in a metal semiconductor field effect transistor (MESFET), said method comprising the steps of:
    providing a gallium arsenide (GaAs) substrate having a major surface;
    forming a gate-defining photoresist mask directly on the major surface over a gate defining region of the substrate;
    sputtering an $SiO_2$ (oxide) layer over said major surface and gate-defining photoresist mask;
    lifting of part of the oxide layer disposed over said gate-defining photoresist mask to form a post-lift off oxide layer having a gate defining opening of a first selected cross-sectional dimension exposing said gate defining region;
    depositing a T-gate masking photoresist layer over said post lift-off oxide layer, with said T-gate masking layer having a top defining opening of a second selected cross-sectional dimension to expose a region of said post-lift oxide layer surrounding said gate defining opening;
    etching a gate recess into said major surface through said gate defining opening;
    depositing a metal layer over said T-gate masking layer and said gate defining opening; and
    stripping the T-gate masking layer to lift-off the metal layer overlying the T-gate masking layer to form a T-gate having a gate width substantially equal to the first selected cross-sectional dimension and top width substantially equal to the second selected cross-sectional dimension.

2. The process of claim 1 wherein the first cross-sectional dimension is about equal to 0.5 microns.

3. The process of claim 1 wherein said step of lifting off further comprises the step of:
    scrubbing the post lift-off oxide layer to remove fingers resulting from said lift off.

4. The process of claim 1 further comprising the step of:
    preparing the major surface to increase adhesion of the oxide layer to said major surface.

5. A method for forming a T-gate in a metal semiconductor field effect transistor (MESFET), said method comprising the steps of:
    providing a gallium arsenide (GaAs) substrate having a major surface;
    forming a gate-defining photoresist mask directly on the major surface over a gate defining region of the substrate;
    evaporating a dielectric layer over said major surface and said gate-defining layer;
    lifting of part of the dielectric layer disposed over said gate-defining photoresist mask to form a post-lift off dielectric layer having a gate defining opening of a first selected cross-sectional dimension exposing said gate defining region;
    depositing a T-gate masking photoresist layer over said post lift-off dielectric layer, with said T-gate masking layer having a top defining opening of a second selected cross-sectional dimension to expose a region of said post-lift dielectric layer surrounding said gate defining opening;
    etching a gate recess into said major surface through said gate defining opening;
    depositing a metal layer over said T-gate masking layer and said gate defining opening; and
    stripping the T-gate masking layer to lift-off the metal layer overlying the T-gate masking layer to form a T-gate having a gate width substantially equal to the first selected cross-sectional dimension and top width substantially equal to the second selected cross-sectional dimension.

6. The process of claim 5 wherein the first cross-sectional dimension is about equal to 0.5 microns.

7. The process of claim 5 further comprising the step of:
    preparing the major surface to increase adhesion of the dielectric layer to said major surface.

8. The process of claim 5 wherein said dielectric is selected from the group consisting of $SiO_2$, $Si_3N_4$, and $SiO_xN_y$.

* * * * *